(12) United States Patent
Dunthorn

(10) Patent No.: US 6,751,564 B2
(45) Date of Patent: Jun. 15, 2004

(54) WAVEFORM ANALYSIS

(76) Inventor: David I. Dunthorn, 908 W. Outer Dr., Oak Ridge, TN (US) 37830

( * ) Notice: Subject to any disclaimer, the term of this patent is extended or adjusted under 35 U.S.C. 154(b) by 67 days.

(21) Appl. No.: 10/157,946

(22) Filed: May 28, 2002

(65) Prior Publication Data

US 2003/0225534 A1 Dec. 4, 2003

(51) Int. Cl.[7] .............................................. G01R 13/00
(52) U.S. Cl. ............................. 702/66; 702/70; 702/77
(58) Field of Search ............................. 702/66, 70, 71, 702/73, 74, 75, 76, 77, 124, 125, 126, 189, 190, 191; 704/320, 330, 331; 708/309, 311, 400, 402–405

(56) References Cited

U.S. PATENT DOCUMENTS

| | | | |
|---|---|---|---|
| 3,932,737 A | | 1/1976 | Delepine |
| 4,283,601 A | | 8/1981 | Nakajima et al. |
| 4,286,326 A | * | 8/1981 | Houdard ........................ 702/76 |
| 4,574,243 A | | 3/1986 | Levine |
| 4,686,457 A | | 8/1987 | Banno |
| 4,783,754 A | | 11/1988 | Bauck et al. |
| 4,829,574 A | | 5/1989 | Dewhurst et al. |
| 4,856,068 A | | 8/1989 | Quatieri, Jr. et al. |
| 4,885,790 A | | 12/1989 | McAuley et al. |
| 4,899,289 A | | 2/1990 | Appel |
| 5,189,727 A | | 2/1993 | Guerreri |
| 5,220,610 A | | 6/1993 | Kane et al. |
| 5,229,716 A | | 7/1993 | Demoment et al. |
| 5,291,426 A | | 3/1994 | Collins et al. |

(List continued on next page.)

OTHER PUBLICATIONS

Robert C. Maher, Evaluation of a Method for Separating Digitized Duet Signals, J. Audio Eng. Soc., vol. 38, No. 12, Dec. 1990, p. 956–979.

Albert H. Nuttall, Weighted Least Squares Fit of a Real Tone to Discrete Data, By Means of an Efficient Fast Fourier Transform Search, NUSC Technical Report 7785, Aug. 27, 1988, AD–A185 910.

Interpolation Techniques for Real–Time Multifrequency Waveform Analysis, IEEE Transactions on Instrumentation and Measurement, 39 (1990) Feb., No. 1, New York, US (6 pages) pp. 106–111.

Extraction of Spectral Peak Parameters Using A Short–Time Fourier Transform Modeling and No Sidelobe Windows, Ph. Depalle, T. Helie, IEEE Workshop on Applications of Signal Processing to Audio and Acoustics, US Oct. 19–22, 1997 (4 pages).

*Primary Examiner*—Bryan Bui
(74) *Attorney, Agent, or Firm*—Luedeka, Neely & Graham, P.C.

(57) ABSTRACT

A method extracts information from a signal, the signal having properties which vary with respect to time. The signal includes a finite number of component signals, the component signals in combination defining the signal. The method analyzes the signal to determine the component signals. The signal analysis includes defining a signal analysis sample interval, the signal analysis sample interval being within a boundary, wherein at least one component signal is included within the signal analysis sample interval. The method transforms the signal over the signal analysis sample interval using a transform method to produce a transform of the signal consisting of transform coefficients. The method fits a function having real and imaginary parameters to a number of transform coefficients to determine a best fit function within the signal analysis sample interval. A mathematical operation performed on the best fit function yields parameter information within the signal analysis sample interval. The method extracts at least one parameter resulting from the mathematical operation, the parameter representing a characteristic of a component signal.

27 Claims, 10 Drawing Sheets

U.S. PATENT DOCUMENTS

| | | |
|---|---|---|
| 5,495,526 A | 2/1996 | Cesaro et al. |
| 5,574,639 A | 11/1996 | Qian et al. |
| 5,677,984 A * | 10/1997 | Mitome .................... 704/220 |
| 5,812,737 A | 9/1998 | Wang |
| 5,889,398 A | 3/1999 | Reck et al. |
| 5,946,649 A | 8/1999 | Javkin et al. |
| 5,970,440 A | 10/1999 | Veldhuis et al. |
| 5,986,199 A | 11/1999 | Peevers |
| 6,026,418 A | 2/2000 | Duncan, Jr. |

\* cited by examiner

WAVEFORM ANALYSIS

FIELD OF THE INVENTION

The present invention is generally directed to a method of analyzing signals. More particularly, the invention is directed to a method for extracting parameter information from a time-varying signal.

BACKGROUND OF THE INVENTION

It is well known that sounds and other mechanical vibration signals typically have actual frequency spectra, especially if the sound persists for even a few cycles of the frequencies involved. A vibrating object will normally produce a fundamental frequency and a sequence of overtones that relate in some manner to the fundamental, often as integer or near-integer multiples. Almost any mechanical system can be described as a collection of such vibrating objects, whether it is a violin string, a human vocal cord, or even a bridge or tall building. If the characteristics of a mechanical system are known well enough, the exact frequency spectrum that it produces can be determined through mechanical modeling. A simple system is shown in FIG. 1.

As shown in FIG. 1, the fundamental frequency is 10.21 Hz and it produces a series of overtones at frequency multiples of 2, 3, 4, 5, and 6. When this mechanical system operates it produces a vibrational signal—in effect a weighted sum of these frequencies and overtones—which is conventionally analyzed using conventional spectrum analysis. FIGS. 2 and 3 illustrate two of the many possibilities for the vibrational signal as a function of time that might be expected from this example system. Both versions are equally valid, differing only in the phase relationships between the different overtone components.

Conventional spectrum analysis as applied to a sound signal or a recording of a sound signal typically makes use of the Fourier Transform, typically some form of a Discrete Fourier Transform (DFT), often the Fast Fourier Transform (FFT), which is a specific manner of implementing a DFT. The DFT requires that a signal be digitized, that is, that a series of samples of the amplitude of the signal be taken at successive increments of time over a short length of time called the sample time or the sample interval. This series of amplitudes over the sample interval is transformed into a corresponding representation which is called the frequency spectrum.

Typical spectrum analysis applies some form or modification of the DFT to a digitized form of the signal sampled over a time interval. The modification of the basic DFT almost invariably includes some form of windowing. Windowing is a process of pre-multiplying the digitized sample by a set of weights in order to improve the amplitude and frequency resolution of the DFT and has been a central part of spectrum analysis during nearly the entire history of using the method on digital computers.

The lowest frequency represented in the spectrum is (1/sample interval), e.g., if the sample interval is 1 second the lowest frequency is 1 Hz. For a DFT, if the increments of time are evenly spaced, then the frequencies in the spectrum that results from the DFT will also be evenly spaced. In the above example 1 Hz is the first frequency represented, so the frequencies will be 1 Hz apart and the frequency spectrum will have entries for 1 Hz, 2 Hz, 3 Hz, 4 Hz, etc. The number of frequencies thus represented will be one-half the number of points in the sample interval. The DFT frequency spectrum resulting from this operation is shown in FIG. 4.

FIG. 4 is computed directly from the real system spectrum shown in FIGS. 1–3 and is an accurate representation of the spectrum for an evenly spaced DFT. The example chosen is far from being a worst case. There is only a superficial resemblance of the so-called DFT frequency spectrum to the actual frequency spectrum of the simple mechanical system (FIG. 1), with considerable "leakage" of the pure frequencies into adjacent frequencies. The visually apparent amplitudes differ substantially and seemingly randomly from the true spectrum. This problem is obvious and serious and was recognized by the early practitioners of digital spectrum analysis.

A single frequency vibrational tone typically causes amplitudes to be detected in several nearby frequencies of the DFT spectrum rather than in just the one or two nearest, due to a phenomenon called sideband leakage. The detected amplitude can vary considerably from that of a known test signal and it is customary—almost universal—to use windowing to minimize this and force the frequency spectrum peak to be sharper and to more nearly approximate the true amplitude. Windowing usually entails multiplying the sampled values by a sequence of numbers chosen so that the result tapers to zero at either end of the sample interval and is the unaltered signal near the middle of the sample interval.

Windowing does offer considerable improvement in comparison to the above graph, and produces a graph intermediate in appearance between the real spectrum and the DFT spectrum, but leakage and consequent seemingly random variations of amplitude remain. While amplitude information can be partially regained by windowing, phase information is essentially completely lost in conventional spectrum analysis.

To obtain higher precision in the frequency of components, conventional spectrum analysis requires a longer sample interval—the signal must be sampled for a longer period of time. A longer sample interval does not necessarily improve the estimates of amplitude, however, and phase information is still lost in the analysis. The requirement for longer sample times in order to obtain greater accuracy of frequency determination is a fact of life in the current state of the art. To get approximately 1 Hz accuracy requires a one second sample time, with ½ second giving approximate 2 Hz accuracy and 0.1 second sample time giving 10 Hz accuracy. Alternative methods of frequency determination such as the various forms of autocorrelation also require comparatively long sample times and tend to work only in situations where the signal is fairly simple, with a single frequency component or with components spaced well apart in frequency.

Time domain analysis has been used to estimate the frequency, amplitude, and phase of some frequency components of real signals. Here a conventional spectrum analysis is customarily used to provide an initial guess at the frequencies of the various components and the sine/cosine pairs for each frequency are fit to the actual time series data using an iterative scheme to converge to better estimates of the individual components. This approach requires a long sample time for accuracy. Time domain analysis falls apart at short sample times or if there are closely spaced frequencies or if there are frequencies which are not included in the analysis for other reasons.

Several techniques can be made to work when signals are stable enough so that long sample times are not a problem. For example, radio and television transmission signals are designed to be stable and can be very accurately detected by many different methods. The difficulty is that mechanical vibrations and sounds in particular are often very unstable. Only over very short intervals is the signal stable enough to be approximated by a combination of pure frequency tones. We as humans very often recognize sounds as having a particular pitch, a particular color resulting from overtone frequency combinations, and a particular loudness. Yet we also track these qualities as they change—sometimes very rapidly—with time. No current state of the art technique can even approximate this.

Therefore, a new method of analyzing signals and extracting information from the signals is needed.

SUMMARY OF THE INVENTION

Advanced frequency domain methods determine the precise frequency, amplitude, and phase of many components over an interval of time that is short enough to permit the tracking of changing signals. In the case of sound, tracking speed is on the same order as that of a human listener. Tracking is the ability to determine a complete and precise actual, nearly instantaneous spectrum based on a very short time interval. Tying together a sequence of such short intervals produces a profile of the frequency components with time. Moreover, components may be spaced closely together in frequency, subject to minor constraints that rarely compromise the useful practical analysis of real signals.

The embodiments described herein are not limited to mechanical vibrations, but are equally applicable to signals from other sources. That is, the methods may be applied to any system where a spectrum analysis or other transform analysis is employed to seek out signals known to be comprised of, or approximated by, weighted sums of components of known characterization. In addition to sounds and other mechanical vibrations, the signals equally can be any of the varieties of signal, including electrical signals, electromagnetic signals, and spatial signals such as those defined in two dimensions by scanned images. The methods are particularly useful when the need is to extract systems of precise frequency components or other characterizable components, and when such determinations must be accomplished using short sample intervals.

One embodiment pertains to a method of extracting information from a signal, the signal having properties which vary with respect to time. The signal includes a finite number of component signals, the component signals in combination defining the signal. The method analyzes the signal to determine the component signals. The signal analysis includes defining a signal analysis sample interval, the signal analysis sample interval being within a boundary, wherein at least one component signal is included within the signal analysis sample interval. The method transforms the signal over the signal analysis sample interval using a transform method to produce a transform of the signal consisting of transform coefficients. The method fits a function having real and imaginary parameters to a number of transform coefficients to determine a best fit function within the signal analysis sample interval. A mathematical operation performed on the best fit function yields parameter information within the signal analysis sample interval. The method extracts at least one parameter resulting from the mathematical operation, the parameter representing a characteristic of a component signal.

Another embodiment pertains to a method of extracting information from a signal. The method converts the signal to a digital format to produce a digitized signal having a number of digital points. A number of the digital points are sampled to produce a digital sample. The method transforms the digital sample to produce a transform of the signal having a number of transform coefficients. The method samples a number of the transform coefficients to produce a transform sample. The method determines signal information from the transform sample by assuming a number of shapes characterize the transform sample, wherein each shape has a characteristic mathematical relation. The method performs a test of statistical significance on the transform sample using one or more shapes, and outputs signal information based on the test of statistical significance.

Yet another embodiment pertains to a method of determining signal information from a signal. The signal is digitized to produce a digital signal. The method samples the digital signal at intervals to produce signal samples and transforms the signal samples to produce a transformed signal. The method fits one or more functions to the transformed signal, each function having real and imaginary components. Signal information is output based on the result of the fit, the signal information having a relation to a ratio of a real to an imaginary component of a fit function.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE INVENTION

Figure 1:
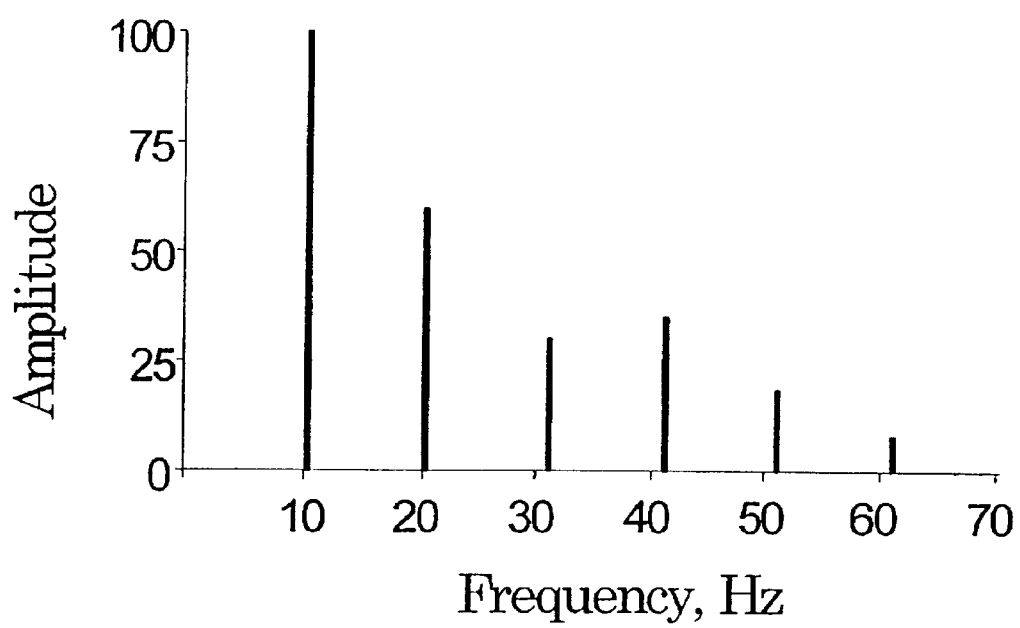
FIG. 1 is a plot of an actual frequency spectrum for a simple mechanical system.
Figure 2:
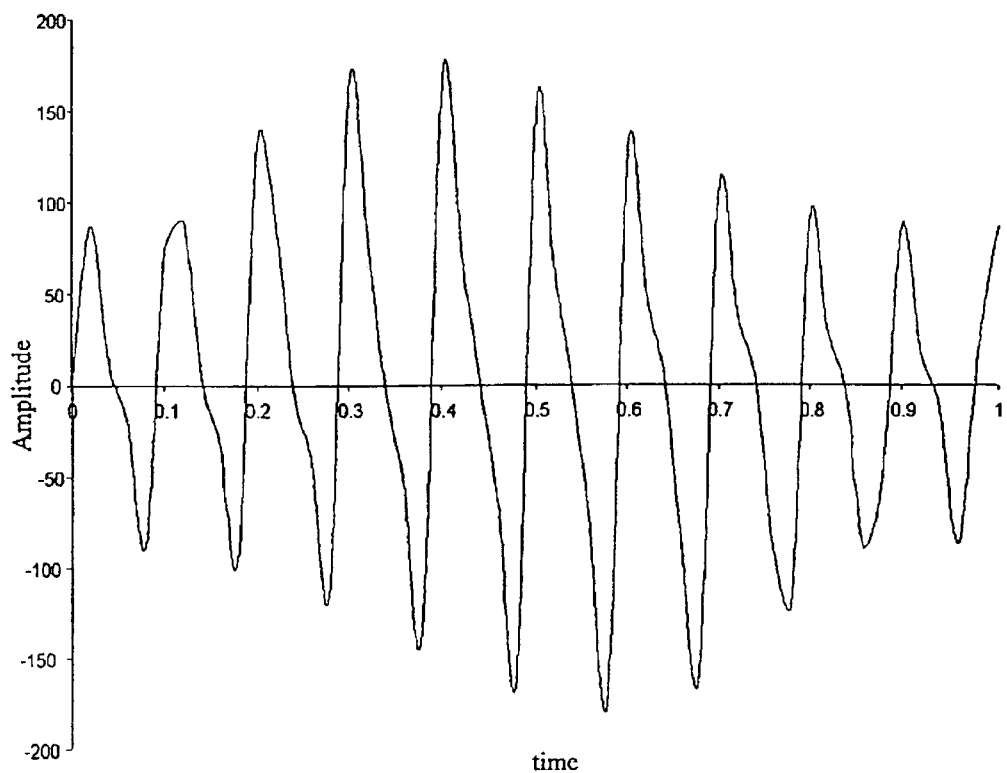
FIG. 2 is a time plot for a signal corresponding to the spectrum of FIG. 1.
Figure 3:
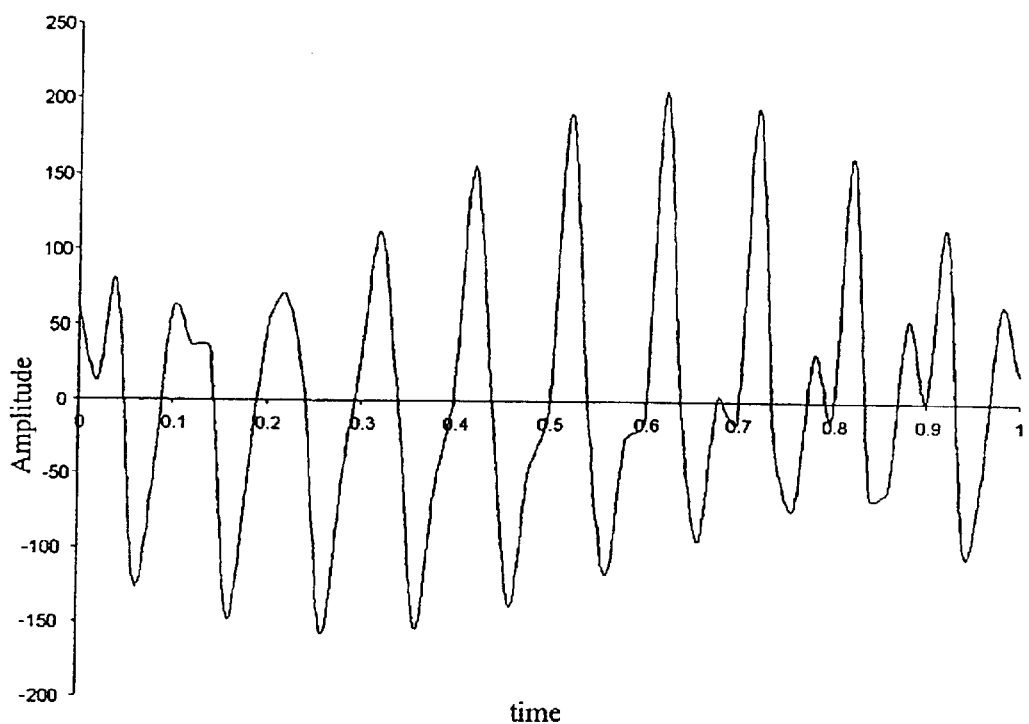
FIG. 3 is a time plot for another signal corresponding to the spectrum of FIG. 1.
Figure 4:
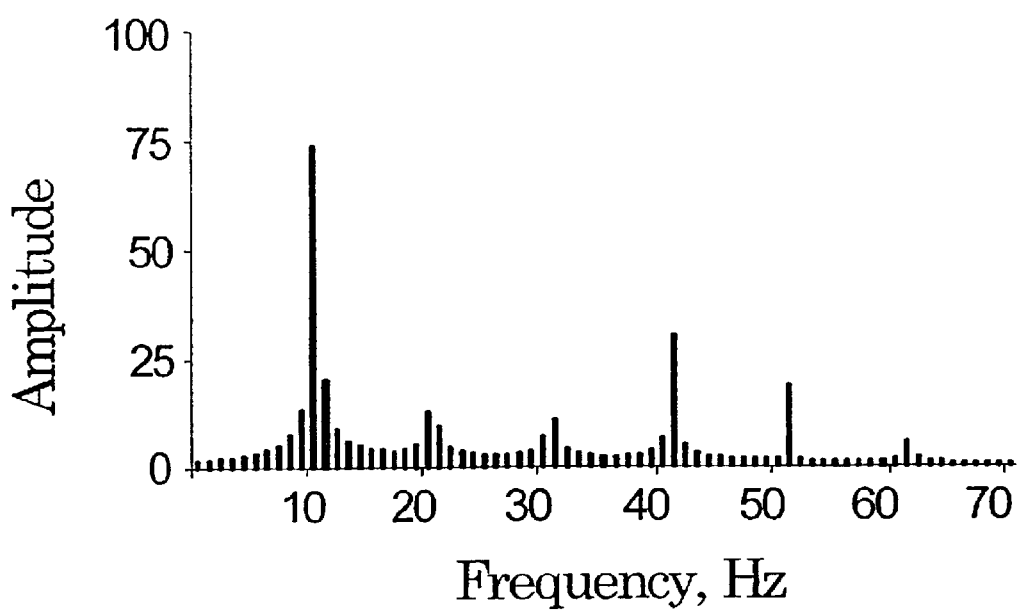
FIG. 4 is a frequency spectrum produced from an evenly spaced Discrete Fourier Transform (DFT) operation corresponding to FIGS. 1–3.

As described below, embodiments of the invention are able to extract precise frequency, amplitude, and phase information from a signal. Many signals may be described as a collection, or a weighted sum, of a small number of waves, or component signals, each having a precise frequency, amplitude, and phase. Most mechanically based systems, including sources of sound signals, can be categorized in this manner by their very nature. Many other signals, including electronic signals from various natural and man-made sources, may also be categorized in the same manner. It is appreciated that the invention is not intended to be limited by any specific examples and can be extended and modified according to a particular application to extract precise frequency, amplitude, and phase information from a signal to characterize the signal.

The method of the invention can also be extended to treat other characteristic components of signals, either separate from or in conjunction with precise frequency sinusoid waves. The other characterization forms can be extensions of sinusoids, such as sinusoids with rapidly rising or falling frequency and/or amplitude, non-sinusoidal general forms, such as impulses, or even very complicated forms that are known to be characteristic of a system producing a signal.

The approach for extracting information from signals is to process the signals using spectrum analysis techniques. However, the preferred methods described herein do not use windowing for extracting the signal information from a signal. Windowing as currently used actually makes it much more difficult to obtain precise frequency, amplitude, and phase characterizations from DFT analysis. However, the method does not preclude windowing because is it is possible to compensate for the effect and thereby certain kinds of windowing may be helpful for some applications. The method may be implemented in a computer readable medium including a computer program, as part of the functionality of a microprocessor, or as part of a larger system.

First, we investigate the behavior of a signal g(t) when subjected to a DFT. The DFT is derived from the integral representing the Fourier transform evaluated over only a finite sample time, $\tau$.

$$F(g(t), n) = \frac{1}{\tau} \int_0^\tau g(t) e^{-\frac{i 2\pi n t}{\tau}} dt \qquad (1)$$

The frequencies used in the DFT are preferably represented as $n/\tau$, where n is an integer and each $$e^{-\frac{i 2\pi n t}{\tau}}$$

is periodic over the sample interval, $\tau$ (since $e^{ix}$=cos x+i sin x). Typically, M evenly spaced values of g(t) are taken to form a sample, at t=0, $\tau$/M, 2$\tau$/M, ..., (M−1)$\tau$/M. It is also appreciated that unevenly spaced values of g(t) may be taken. In one aspect of the analysis, we are interested in the case where g(t) is a sinusoid with a frequency that does not necessarily match the exact integer frequency spacings of the DFT, i.e. 2n$\pi$/$\tau$, but may be represented as 2(n+$\delta$)$\pi$/$\tau$. In general, $$g(t) A e^{\frac{i 2\pi (n+\delta) t}{\tau}},$$

where A is a complex constant, and $$F(g(t), n) = \frac{A}{\tau} \int_0^\tau e^{\frac{i 2\pi (n+\delta) t}{\tau}} e^{-\frac{i 2\pi n t}{\tau}} dt \qquad (2)$$

$$= \frac{A}{\tau} \int_0^\tau e^{\frac{i 2\pi \delta t}{\tau}} dt$$

Which evaluates to:

$$F(g(t), n) = \frac{i A (1 - e^{i 2\pi \delta})}{2\pi \delta} \qquad (3)$$

Notice that the value is independent of n and relates only to $\delta$, the displacement of the frequency of interest from the integer frequency n. As used herein, a frequency of interest is defined as an essential frequency of the signal under analysis. More particularly, any signal may include one or more frequencies, defined as essential frequencies, characterizing the nature of the signal. In fact, $\delta$ can be any value and we prefer to define $\delta$=k+$\epsilon$, where k is a principle integer value of $\delta$ and $\epsilon$ is the difference remaining, typically but not necessarily a fraction, so that we have:

$$F(g(t), n) = \frac{i A (1 - e^{i 2\pi (k+\epsilon)})}{2\pi (k+\epsilon)} = \frac{i A (1 - e^{i 2\pi k} e^{i 2\pi \epsilon})}{2\pi (k+\epsilon)} = \frac{i A (1 - e^{i 2\pi \epsilon})}{2\pi (k+\epsilon)} \qquad (4)$$

since k is an integer value and $e^{i 2\pi k}$=1.

In practice we will be analyzing a set of DFT coefficients F(n) for a sequential range of n. For each of the successive increasing values of n, $\delta$ will be one less, since the (fixed) frequency of our g(t) is represented by n+$\delta$. Since $\delta$=k+$\epsilon$, k will also decrease by one for each successive $\delta$ and $\epsilon$ will remain constant. Thus, from a sequence of DFT transform coefficients y, where we use the shortened notation y=F(g(t),n), we will be trying to determine $\epsilon$ from the values of transform coefficient y at different values of k. In practice, the integer k will be seen to be an index number of transform coefficient y corresponding to the position of y within the DFT sequence of transform coefficients. A function we may be trying to fit to the DFT coefficients is, for example:

$$y = A \frac{i(1 - e^{i 2\pi \epsilon})}{2\pi (k+\epsilon)} \qquad (5)$$

For this analysis, we can recognize that $$A' = A \frac{i(1 - e^{i 2\pi \epsilon})}{2\pi}$$

is a single complex constant for the purposes of the fit and $\epsilon$ is a single real constant. The value of A can be found once A' and $\epsilon$ have been determined. This leaves us with $$y = \frac{A'}{(k+\epsilon)} \qquad (6)$$

which is the basic form of any single specific frequency signal as represented in the DFT coefficients.

Figure 5:
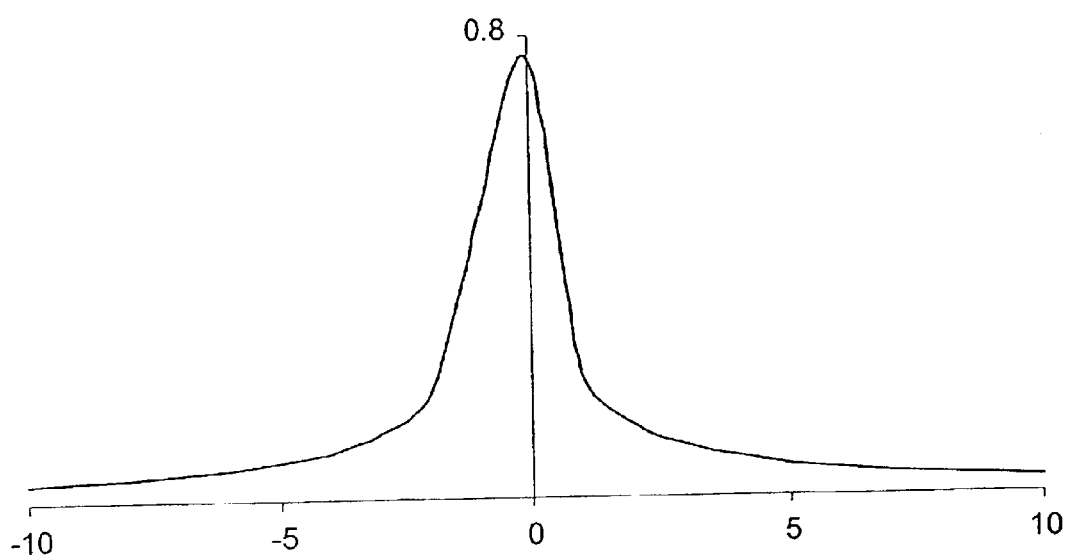
FIG. 5 is a plot of an equation representing a single specific frequency signal.

As shown in FIG. 5, equation (6) represents a sharp, generally asymmetrical peak with long tails on either side ($\epsilon$=0.4). Although the function is shown as continuous, it is important to remember that the function only has values for integer values of k. The peak becomes extremely sharp for $\epsilon \approx 0$ and $\epsilon \approx 1$ and is broadest at $\epsilon$=0.5.

For the purpose of doing a least squares fit to the equation, it is preferable to put the equation into linear form (i.e. linear with respect to the fitting constants), greatly simplifying the computations required to perform the fit.

$$k = -\epsilon + \frac{A'}{y} \qquad (7)$$

Equation (7) is one such form and will be used here although it is possible to use any other representation of Equation (6), linear or nonlinear, to formulate a least squares fit. Equation (7) is unusual for two reasons. First, a least squares fit to this form will be a fit to k, normally thought of as the independent variable, in terms of y, normally thought of as the dependent variable. Second, k and $\epsilon$ are definitely real, while A' and y are complex. Special consideration should be given both these unusual features.

For a least squares fit to Equation (7), the sum, $$\sum_j (k_j - \hat{k}_j)\overline{(k_j - \hat{k}_j)}$$

is minimized, where $\hat{k}_j$ is the value calculated from the fit that corresponds to $k_j$ and j is incremented to include all of the DFT coefficients actually chosen for the fit. Here the overbar indicates complex conjugate, and we sum the magnitude differences squared instead of $(k_j - \hat{k}_j)^2$ because $\hat{k}_j$ is regarded as complex, containing the term A'/yj. Because $k_j$ is real, the $\hat{k}_j$ resulting from the fit should be very nearly real.

To perform this least squares fit it is preferred to minimize $$\sum_j (y_j - \hat{y}_j)\overline{(y_j - \hat{y}_j)},$$

the sum of the magnitude differences squared for the independent variable in Equation (6). We can approximate this by including a weighting factor $w_j$ in the original sum, such that:

$$w_j(k_j - \hat{k}_j)\overline{(k_j - \hat{k}_j)} \approx (y_j - \hat{y}_j)\overline{(y_j - \hat{y}_j)}$$

To do this in this case it is useful to think in terms of small differences, whereby we can approximate:

$$w_j \left| \Delta k_j \right|^2 \approx \left| \Delta y_j \right|^2$$

$$w_j \approx \frac{|\Delta y_j|^2}{|\Delta k_j|^2} \approx \left|\frac{dy}{dk}\right|^2 \approx \frac{|y_j|^4}{|A'|^2}$$

with $$\frac{dy}{dk}$$

resulting from differentiating Equation (6) [or Equation (7)]. Since $|A'|^2$ is a constant, it will have no effect on the minimization, so the primary weighting factor is:

$$w_j = |y_j|^4 \quad (8)$$

Note that this weighting factor merely restores the fit so that it more closely matches a least squares fit to Equation (6). Other weighting factors may be found to have more desirable characteristics in practice and the weighting factor should be tailored to perform well in a particular application.

Unlike the integer-spaced frequency sinusoids represented in the DFT, the precise frequency sinusoids are, in general, not orthogonal to one another. It is preferred to select a very limited range of successive DFT coefficients and to perform a least squares fit on that range. The range is chosen so that one or at most a very few precise frequency components are expected to lie therein. The range also must include enough coefficients to give the degrees of freedom required for determining the least squares fitting constants, and it is preferred to include a few more than the minimum number to permit error smoothing.

Even so, in performing a least squares fit to obtain one precise frequency, other frequencies beyond the range of DFT coefficients may confound with the target and distort its value. As shown in the FIG. 5, Equation (6) has a peak value at the precise frequency and tapers off in amplitude both above and below the precise frequency represented. It can be expected that the DFT coefficients in the vicinity of each targeted precise frequency signal will also include the sum of the tails of other precise frequencies from both above and below the target. The ones above will taper off slightly for DFT coefficients at decreasing frequencies and the ones below will taper off for DFT coefficients at increasing frequencies. It is useful to include an approximation of these added tails in any least squares fit. In one embodiment, an approximating parabola is used, i.e. $C + Sk + Tk^2$, where C, S, and T are complex.

$$y = \frac{A'}{(k+\varepsilon)} + C + Sk + Tk^2 \quad (9)$$

It is appreciated that other approximations may also be used.

Furthermore, it is preferable to allow for the possibility of several independent precise frequency components to be included within the range of DFT coefficients which we are analyzing. For such frequencies, Equation (6) generalizes to:

$$y = C + Sk + Tk^2 + \sum_{p=1}^{n} \frac{A'_p}{(k+\varepsilon_p)} \quad (10)$$

Similarly to the way in which equation (7) was derived, Equation (10) becomes:

$$y = a_0 + a_1 k + a_2 k^2 + \sum_{p=1}^{n} \left[ a_{p+2} \frac{1}{k^p} + b_p \frac{y}{k^p} \right] \quad (11)$$

Here the fitting constants a are complex and the fitting constants b are real and in general the $\epsilon_p$ are the solutions of $$x^n + \sum_{p=1}^{n} (-1)^{p+1} b_{n-p} x^{n-p} = 0 \quad (12)$$

For n=1, 2, and 3, the linear, quadratic, and cubic solutions are:

Linear: $\varepsilon_1 = -b_1 \quad (13)$

Quadratic: $\varepsilon_1 = \frac{-b_1 - \sqrt{b_1^2 + 4b_2}}{2} \quad (14)$ $$\varepsilon_2 = \frac{-b_1 - \sqrt{b_1^2 + 4b_2}}{2} \quad (15)$$

Cubic:
$z = -36b_1 b_2 - 108 b_3 - 8b_1^3 +$
$\quad 12\sqrt{-12b_2^3 - 3b_2^2 b_1^2 + 54 b_1 b_2 b_3 + 81 b_3^2 + 12 b_3 b_1^3}$ $$w = \frac{-\frac{b_2}{3} - \frac{b_1^2}{9}}{z^{\frac{1}{3}}}$$

$$\varepsilon_1 = \frac{z^{\frac{1}{3}}}{6} - 6w - \frac{b_1}{3} \quad (16)$$

$$\varepsilon_2 = -\left(\frac{z^{\frac{1}{3}}}{12} + 3w - \frac{b_1}{3} - \frac{i\sqrt{3}}{2}\left(\frac{z^{\frac{1}{3}}}{6} + 6w\right)\right) \quad (17)$$

$$\varepsilon_3 = -\left(\frac{z^{\frac{1}{3}}}{12} + 3w - \frac{b_1}{3} + \frac{i\sqrt{3}}{2}\left(\frac{z^{\frac{1}{3}}}{6} + 6w\right)\right) \quad (18)$$

It can be shown that for n=1, 2, and 3:

$$T = a_2 \quad (19)$$

$$S = a_1 - T\sum_{p=1}^{n}\varepsilon_p \quad (20)$$

$$C = a_0 - S\sum_{p=1}^{n}\varepsilon_p - T\sum_{q=1}^{n}\sum_{r=q+1}^{n}\varepsilon_r\varepsilon_p \quad (21)$$

The fitting constants for $a_3 \ldots a_{n+2}$ along with the above results formulate into a series of n linear equations in the n unknowns, $A_p'$. Corresponding to the linear, quadratic, and cubic cases for $\epsilon$ above, the solutions are:

Linear: $\quad A_1' = a_3 - C\varepsilon_1 \quad (22)$

Quadratic: $\quad A_1' = \dfrac{C\varepsilon_1^2 + S\varepsilon_1^2\varepsilon_2 + a_4 - a_3\varepsilon_1}{\varepsilon_2 - \varepsilon_1} \quad (23)$ $$A_2' = \frac{C\varepsilon_2^2 + S\varepsilon_2^2\varepsilon_1 + a_4 - a_3\varepsilon_2}{\varepsilon_1 - \varepsilon_2} \quad (24)$$

Cubic: $\quad A_1' = \dfrac{[S(\varepsilon_2+\varepsilon_3)+T\varepsilon_2\varepsilon_3+C]\varepsilon_1^3 - a_5 + a_1\varepsilon_1 - a_3\varepsilon_1^2}{(\varepsilon_1-\varepsilon_3)(\varepsilon_2-\varepsilon_1)} \quad (25)$ $$A_2' = \frac{[S(\varepsilon_1+\varepsilon_3)+T\varepsilon_1\varepsilon_3+C]\varepsilon_2^3 - a_5 + a_4\varepsilon_2 - a_3\varepsilon_2^2}{(\varepsilon_2-\varepsilon_3)(\varepsilon_1-\varepsilon_2)} \quad (26)$$

$$A_3' = \quad (27)$$
$$\frac{[S(\varepsilon_1+\varepsilon_2)+T\varepsilon_1\varepsilon_2+C]\varepsilon_3^3 - a_5 + a_4\varepsilon_3 - a_3\varepsilon_3^2}{(\varepsilon_3-\varepsilon_1)(\varepsilon_2-\varepsilon_3)}$$

In each case above, $$A_p = A_p'\frac{2\pi i}{(e^{2\pi i \varepsilon_p} - 1)} \quad (28)$$

giving the precise frequency, $\epsilon_p$, and complex amplitude, $A_p$, (or amplitude and phase) of each of the n precise frequency components. Equations (11) and (12) apply for all n, the number of precise frequencies being simultaneously treated.

The algebra and analytic algebraic techniques become more involved with increasing n. It is appreciated that the method can be extended n>3 (quartic equations have an exact solution and the treatment is identical). For n>4, the solutions may be obtained using numerical methods for polynomials. However, $n \leq 3$ may be sufficient for most practical applications.

For example, many single tones on a piano result from striking three strings at once, resulting in three slightly different frequencies. These three tones are perceived as one by the human ear, although the "color" of the tone may be altered if the differences are fairly large. However, over a short sample time this coloration is not perceived. If the difference in frequencies is large enough to be perceived during the sample time, the method will almost certainly allow the determination of the individual components. Conversely, if the differences in frequency between the strings are small enough to be perceived as "beats" by the human ear, the method will more usefully report the effect as single frequency components with slowly changing amplitude. These precise frequency components which are close enough together to be reported as a single tone are generally exactly what is sought.

As described above, it is preferred to perform the fit using least squares methods. In one such preferred method, the least squares fit may be performed for the form in Equation 11 using the following matrix formulation derived directly from the least squares requirement. This requirement may be expressed as:

$$M\alpha = \beta$$

where $\alpha$ is the vector of fitting constants and $\beta$ is the vector of dependent variables and where each element below represents a sum with the index j varying to include the total number of DFT coefficients being fit.

$$\alpha = \begin{bmatrix} \alpha_{R0} \\ \alpha_{I0} \\ \alpha_{R1} \\ \alpha_{I1} \\ \alpha_{R2} \\ \alpha_{I2} \\ \alpha_{R3} \\ \alpha_{I3} \\ \vdots \\ \alpha_{Rn+2} \\ \alpha_{In+2} \\ b_1 \\ \vdots \\ b_n \end{bmatrix} \quad \beta = \begin{bmatrix} w_j y_{Rj} \\ w_j y_{Ij} \\ w_j y_{Rj} k_j \\ w_j y_{Ij} k_j \\ w_j y_{Rj} k_j^2 \\ w_j y_{Ij} k_j^2 \\ w_j y_{Rj} k_j^{-1} \\ w_j y_{Ij} k_j^{-1} \\ \vdots \\ w_j y_{Rj} k_j^{-n} \\ w_j y_{Ij} k_j^{-n} \\ w_j |y_j|^2 k_j^{-1} \\ \vdots \\ w_j |y_j|^2 k_j^{-n} \end{bmatrix} \quad (29)$$

In the matrix M below, each element also represents a sum with the index j varying to include the total number of DFT coefficients being fit. To simplify the notation, all elements of M also carry an implicit $w_j$, the weighting factor. For example, in the representation below, $$M_{1,1} = \sum_j w_j$$

and the last element of the first row is $$M_{1,2n+3} = \sum_{j} w_j \text{Real}(y_j) k^{-n}. \tag{30}$$

$$\begin{bmatrix}
1 & 0 & k & 0 & k^2 & 0 & k^{-1} & 0 & \ldots & k^{-n} & 0 & y_R k^{-1} & \ldots & y_R k^{-n} \\
0 & 1 & 0 & k & 0 & k^2 & 0 & k^{-1} & \ldots & 0 & k^{-n} & y_I k^{-1} & \ldots & y_I k^{-n} \\
k & 0 & k^2 & 0 & k^3 & 0 & 1 & 0 & \ldots & k^{1-n} & 0 & y_R & \ldots & y_R k^{1-n} \\
0 & k & 0 & k^2 & 0 & k^3 & 0 & 1 & \ldots & 0 & k^{1-n} & y_I & \ldots & y_I k^{1-n} \\
k^2 & 0 & k^3 & 0 & k^4 & 0 & k & 0 & \ldots & k^{2-n} & 0 & y_R k & \ldots & y_R k^{2-n} \\
0 & k^2 & 0 & k^3 & 0 & k^4 & 0 & k & \ldots & 0 & k^{2-n} & y_I k & \ldots & y_I k^{2-n} \\
k^{-1} & 0 & 1 & 0 & k & 0 & k^{-2} & 0 & \ldots & k^{-1-n} & 0 & y_R k^{-2} & \ldots & y_R k^{-1-n} \\
0 & k^{-1} & 0 & 1 & 0 & k & 0 & k^{-2} & \ldots & 0 & k^{-1-n} & y_I k^{-2} & \ldots & y_I k^{-1-n} \\
\vdots & \vdots & \vdots & \vdots & \vdots & \vdots & \vdots & \vdots & \ldots & \vdots & \vdots & \vdots & \ldots & \vdots \\
k^{-n} & 0 & k^{1-n} & 0 & k^{2-n} & 0 & k^{-1-n} & 0 & \ldots & k^{-2n} & 0 & y_R k^{-1-n} & \ldots & y_R k^{-2n} \\
0 & k^{-n} & 0 & k^{1-n} & 0 & k^{2-n} & 0 & k^{-1-n} & \ldots & 0 & 0 & y_I k^{-1-n} & \ldots & y_I k^{-2n} \\
y_R k^{-1} & y_I k^{-1} & y_R & y_I & y_R k & y_I k & y_R k^{-2} & y_I k^{-2} & \ldots & y_R k^{-1-n} & y_I k^{-1-n} & |y|^2 k^{-2} & \ldots & |y|^2 k^{-1-n} \\
\vdots & \vdots & \vdots & \vdots & \vdots & \vdots & \vdots & \vdots & \ldots & \vdots & \vdots & \vdots & \ldots & \vdots \\
y_R k^{-n} & y_I k^{-n} & y_R k^{1-n} & y_I k^{1-n} & y_R k^{2-n} & y_I k^{2-n} & y_R k^{-1-n} & y_I k^{-1-n} & \ldots & y_R k^{-2n} & y_I k^{-2n} & |y|^2 k^{-1-n} & \ldots & |y|^2 k^{-2n}
\end{bmatrix}$$

The fitting constants α may be obtained by solving $M\alpha = \beta$, which may be done by inverting the matrix $\alpha = M^{-1}\beta$ or by other means. The frequencies and amplitudes may then be obtained from the linear fitting constants as shown above.

In tests using constructed signals, the waveform analysis method tended to determine the frequency and complex amplitude of the separate components with a high degree of precision providing that there were no more than the maximum allowed number of precise frequency components bracketed within the range of DFT coefficients being used in the calculation.

Table 1 below shows a test set of frequency and amplitude data, designated "actual," used to construct a test waveform, along with the results of a precise frequency analysis of the test waveform using the waveform analysis method. The "actual" data were used to construct a time series of 2048 points such that there was a spacing of 4 Hz between the resulting DFT frequency cells. For the first test, n=1. That is, only one frequency was sought in each analysis, and each analysis used a span of 8 adjacent DFT frequency cells, representing a band of 28 Hz.

TABLE 1

| | Frequency, Hz | | Real Amplitude | | Imaginary Amplitude | |
|---|---|---|---|---|---|---|
| | Actual | Result | Actual | Result | Actual | Result |
| 1 | 147.260 | 147.259 | −221.045 | −221.041 | 225.693 | 225.694 |
| 2 | 322.112 | 322.112 | 43.013 | 42.990 | −139.195 | −139.201 |
| 3 | 626.015 | 626.015 | −45.116 | −45.116 | 71.058 | 71.059 |
| 4 | 1261.860 | 1261.858 | −26.041 | −26.033 | 15.676 | 15.689 |
| 5 | 1361.229 | 1361.230 | 21.725 | 21.720 | 20.599 | 20.609 |
| 6 | 1595.101 | 1597.083 | −10.951 | −41.288 | 12.837 | −8.379 |
| 7 | 1598.242 | | −18.539 | | −20.846 | |
| 8 | 2422.612 | 2422.613 | 6.942 | 6.945 | −18.266 | −18.264 |
| 9 | 2557.597 | 2557.597 | 3.872 | 3.869 | 15.142 | 15.142 |
| 10 | 2731.215 | 2731.215 | −9.354 | −9.354 | −3.049 | −3.048 |
| 11 | 3038.371 | 3038.371 | 5.828 | 5.828 | −5.718 | −5.718 |

TABLE 1-continued

| | Frequency, Hz | | Real Amplitude | | Imaginary Amplitude | |
|---|---|---|---|---|---|---|
| | Actual | Result | Actual | Result | Actual | Result |
| 12 | 3357.234 | 3357.234 | 0.885 | 0.885 | 13.684 | 13.684 |
| 13 | 3665.301 | 3668.581 | 6.910 | 0.858 | −5.859 | 5.356 |
| 14 | 3668.789 | | −6.367 | | 1.969 | |
| 15 | 3672.974 | | 5.546 | | −1.545 | |
| 16 | 3898.634 | 3898.633 | −5.793 | −5.793 | −0.629 | −0.629 |

Most of the results in Table 1 are close matches to the actual data. This is typical behavior for low noise situations. The results which do not match the actual data in Table 1 are all instances in which two or more frequencies are close together, entries 6, 7 and 13–15. In these cases, the frequency result obtained is a weighted average of the group of nearby frequencies and the amplitude is a more approximate but also very appropriate average. In these cases the group of frequencies is being interpreted as a single frequency of varying amplitude, essentially the phenomenon called "beats" in the study of sound. The amplitude is a snapshot average of the varying amplitude. In many cases this is the desired behavior rather than the actual set of precise frequencies. For example, a higher piano tone considered as a single frequency is actually produced by three strings which may vary slightly in precise frequency.

TABLE 2

| | Frequency, Hz | | Real Amplitude | | Imaginary Amplitude | |
|---|---|---|---|---|---|---|
| | Actual | Result | Actual | Result | Actual | Result |
| 1 | 147.260 | 147.259 | −221.045 | −221.041 | 225.693 | 225.694 |
| 2 | 322.112 | 322.112 | 43.013 | 42.990 | −139.195 | −139.201 |
| 3 | 626.015 | 626.015 | −45.116 | −45.116 | 71.058 | 71.059 |
| 4 | 1261.860 | 1261.860 | −26.041 | −26.040 | 15.676 | 15.676 |

TABLE 2-continued

| Frequency, Hz | | Real Amplitude | | Imaginary Amplitude | |
|---|---|---|---|---|---|
| Actual | Result | Actual | Result | Actual | Result |
| 5 1361.229 | 1361.230 | 21.725 | 21.720 | 20.599 | 20.609 |
| 6 1595.101 | 1595.101 | −10.951 | −10.961 | 12.837 | 12.839 |
| 7 1598.242 | 1598.243 | −18.539 | −18.528 | −20.846 | −20.845 |
| 8 2422.612 | 2422.613 | 6.942 | 6.945 | −18.266 | −18.264 |
| 9 2557.597 | 2557.597 | 3.872 | 3.869 | 15.142 | 15.142 |
| 10 2731.215 | 2731.215 | −9.354 | −9.354 | −3.049 | −3.048 |
| 11 3038.371 | 3038.371 | 5.828 | 5.828 | −5.718 | −5.718 |
| 12 3357.234 | 3357.234 | 0.885 | 0.885 | 13.684 | 13.684 |
| 13 3665.301 | 3665.303 | 6.910 | 6.923 | −5.859 | −5.861 |
| 14 3668.789 | 3668.786 | −6.367 | −6.376 | 1.969 | 1.962 |
| 15 3672.974 | 3672.977 | 5.546 | 5.541 | −1.545 | −1.537 |
| 16 3898.634 | 3898.633 | −5.793 | −5.793 | −0.629 | −0.629 |

Table 2 shows the result of using n=1, 2, or 3, as found appropriate. That is, fitting for any as 3 precise frequencies in an interval of 11 DFT cells, or 40 Hz. The results in Table 2 are a close match for the actual data in every case.

While the accuracy of the results shown benefits from the low noise condition, the method also works well in situations with noise. As would be expected, the nature of the noise is important. For instance, if the noise is periodic or quasi-periodic, it typically will be resolved as precise frequency components and will interfere only as those components conflict with sought components. If the noise is random, the interference will depend upon the spectral pattern of the noise as resolved by the DFT.

For instance, the effect of random noise may be characterized in that the error in the amplitude of precise frequency components will be on the same order as the DFT amplitude of the noise in that region of the spectrum.

It is often possible to resolve a precise frequency within a percent or two and resolve an approximate real amplitude, even when the real amplitude of the noise in the spectrum is much greater than the precise signal being sought. The method may actually benefit from a small amount of noise in the signal. When fitting for n precise frequencies in a region where less than n actual precise frequencies exist, the noise gives the unused frequencies something to find, stabilizing the calculation. The extra frequencies can be recognized as spurious through tests involving statistical significance.

In the above example, no particular significance should be attached the fact that the signal included 16 frequencies, nor that 2048 points were used in the fit. These numbers are convenient for illustration purposes. In practice, the number of precise frequencies sought is often much greater and the sample size is varied smaller or larger as required according to the particular situation to achieve best results.

Figure 6:
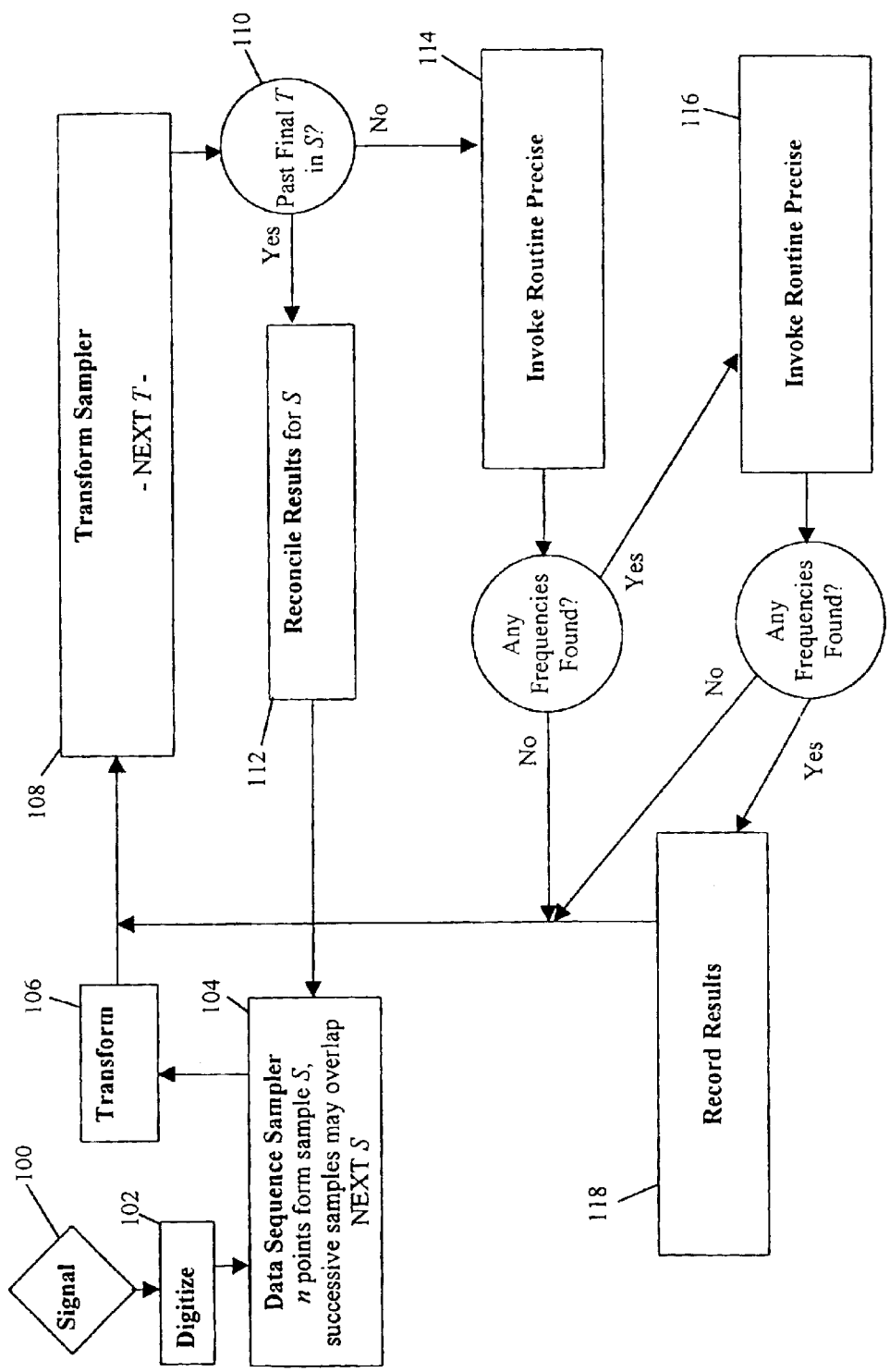
FIG. 6 is a flow diagram depicting streaming analysis.

Referring now to FIGS. 6–11, a flow diagram depicts a most preferred embodiment of the waveform analysis method. As used herein, FIG. 6 is referred to as a basic streaming analysis module. As described further below, the basic streaming analysis module, steps 100–118, is operable to produce a stream of parameters, preferably precise parameter (frequency, complex amplitude) sets at successive time intervals. Each time interval may be expected to have more than one frequency and complex amplitude.

At step 100, a signal is provided for analysis. The signal may be produced by, for example, a mechanical, electrical, or other signal producing source. Many signal sources exist, such as signal transmitters, electromagnetic disturbances, musical instruments, optical sources, etc. or any other signal providers. The method may also be used to analyze spatial systems, providing detailed information about the spatial system. For example, the procedures detailed herein may be used in image analysis applications, providing detailed image information from an image. It is appreciated that the examples and various aspects detailed herein are not intended to limit the invention scope and it will be apparent that there are many more applications of the waveform analysis methodologies described herein.

Figure 7:
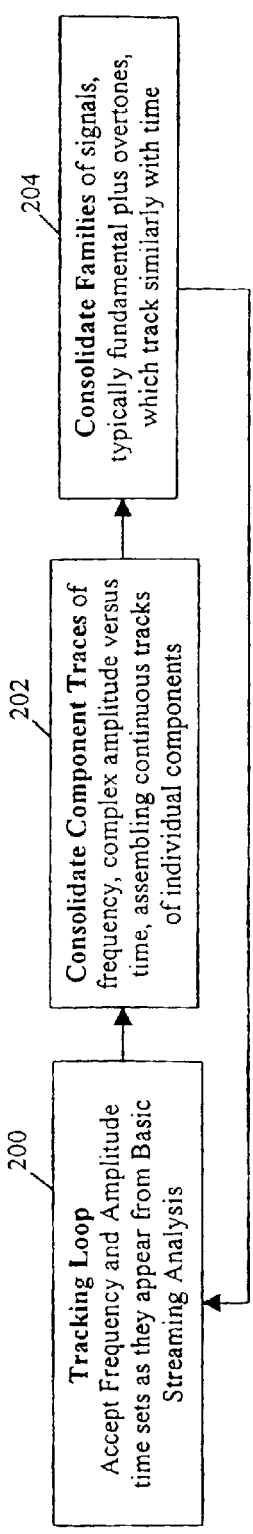
FIG. 7 is a flow diagram depicting a frequency consolidation routine.

As shown in the flow diagram of FIG. 7, at step 200, frequency and amplitude time sets are input to the frequency consolidation routine as they appear from the basic streaming analysis module. Most preferably, the frequency consolidation routine runs asynchronously with the basic streaming analysis module. By "asynchronously" it is meant that the routine will process available data and post its results at its own rate, cooperating with but not being controlled by other routines.

Frequency traces may be consolidated by recognizing that a typical component will register in successive time intervals as a slowly varying frequency expressed at a slowly varying amplitude (step 202). Components with similar expressions in successive time intervals may be collected to form the trace of a single component with time. As these traces are identified and assembled, some sets of traces may tend to track together as nearly constant multiples (step 204). A fundamental frequency and its overtones are one example. These traces may be collected together to represent a trace of common origin.

Figure 8:
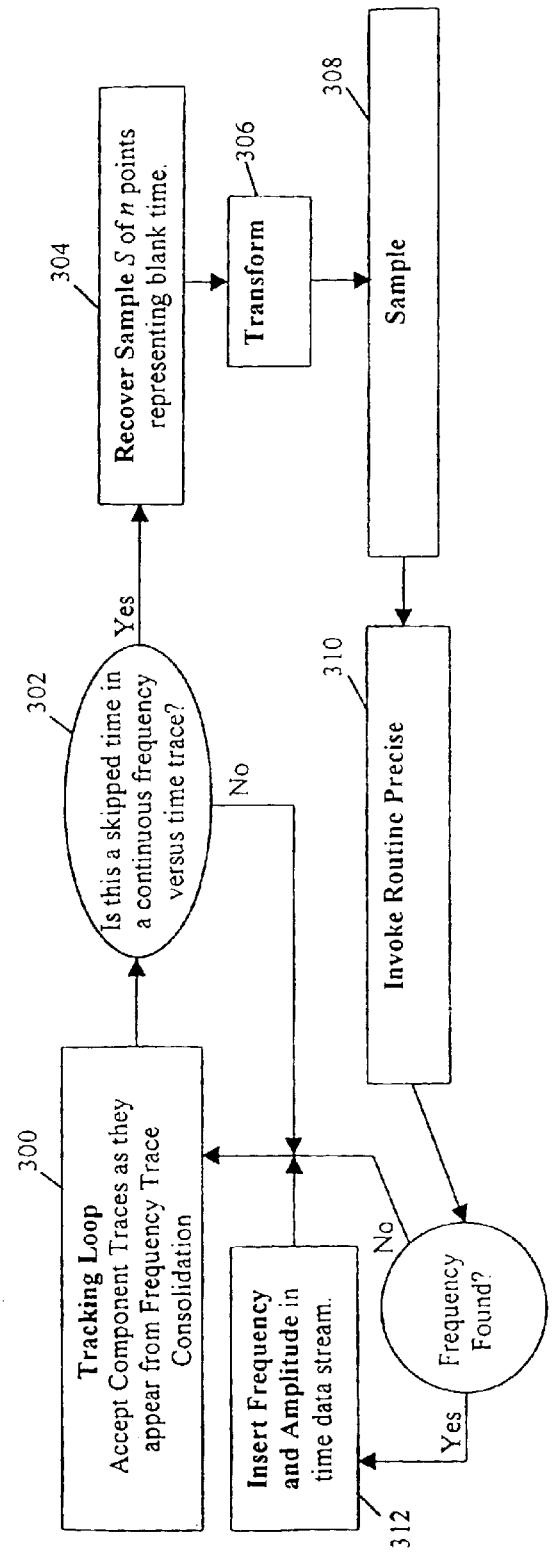
FIG. 8 is a flow diagram depicting a gap analysis routine.

Once the traces have been consolidated, they can be refined by various means, three of which are described more fully below with reference to FIGS. 8–10. For example, traces may be disrupted by noise, interference, or other causes. The gap analysis routine (FIG. 8, steps 300–312) reexamines the data at a time where a continuous trace would have produced a frequency record and tests for that frequency with considerably lowered criteria for significance, as described further below. If a result is found of comparable amplitude to the missing signal, the trace is continuous, otherwise the gap is real.

Each of five routines diagrammed separately as FIGS. 6–10 runs asynchronously with the others. That is, each of these asynchronous routines independently checks whether data is available for processing and each posts the results of its processing, which results may form data for other routines. The "tracking loops" referenced in FIGS. 7–10 are coordinated mechanisms for handling this checking and posting of the asynchronous routines.

At step 300, a tracking loop accepts component traces from the frequency consolidation routine. At step 302, the gap analysis routine determines whether a skipped time in a continuous frequency versus time trace has occurred. If a skipped time has occurred, the routine recovers a sample S of n points representing blank time (step 304). If a skipped time has not occurred, the routine loops back to step 300.

The recovered sample S is transformed at step 306. At step 308, the gap analysis routine selects m sequential coefficients of the transformed data to form transform sample T, the sampled coefficients preferably surrounding the target frequency. It is also preferable to avoid adjacent frequencies where possible.

At step 310, the gap analysis routine invokes routine precise (FIG. 11), described further below, which operates upon the transform sample T. It is most preferable to invoke routine precise using normal weights and shapes, and significance testing criteria reduced below basic analysis levels. The significance criteria is reduced because the expected frequency is known and was not found in a previous analysis using normal significance levels.

If the gap analysis routine locates a frequency, the located frequency and corresponding amplitude are inserted into the time data steam (step 312), otherwise the routine loops back to step 300.

Figure 9:
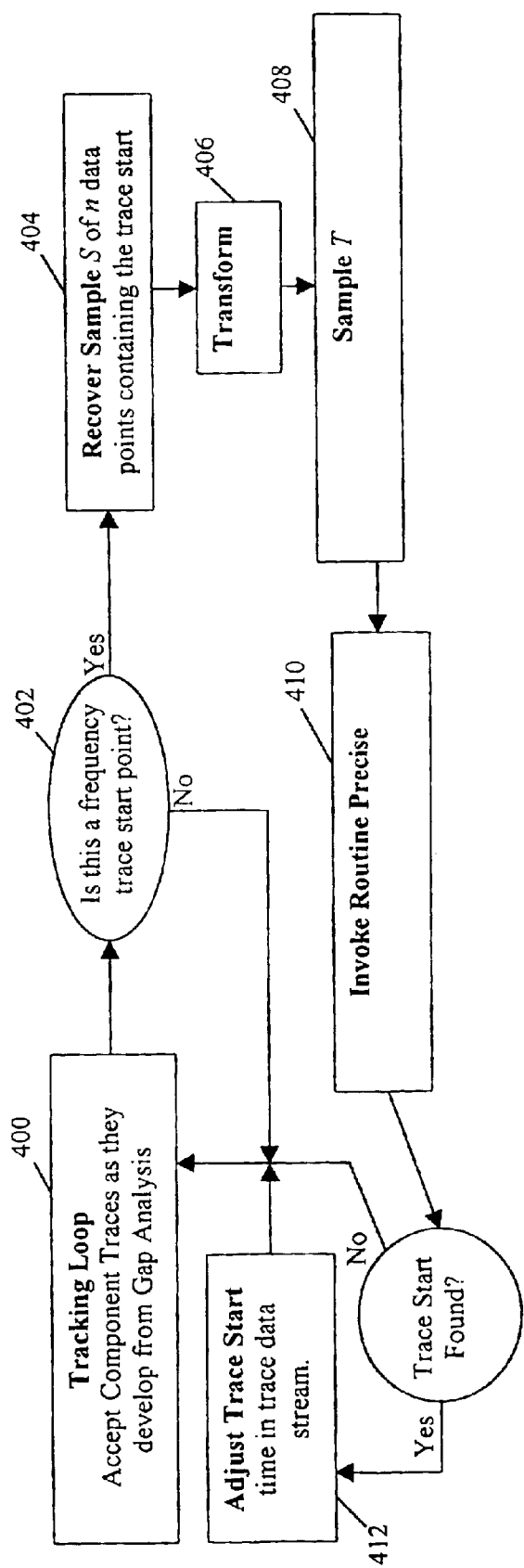
FIG. 9 is a flow diagram depicting a start time routine.

FIG. 9 depicts a start time routine. Steps 400–412 operate to determine a more precise start time for a trace by reexamining the data at an approximate start time. For example, as described below, a different fitting shape may be used based on the frequency being present for only part of the sample time. Thus, a more precise start time may be calculated for a given signal.

At step 400, a tracking loop accepts component traces from the gap analysis routine. The start time routine then determines if there is a frequency trace start point (step 402). If the routine determines that this is a frequency trace starting point, a sample S of n points is recovered, including the trace starting point (step 404). If the routine does not determine a trace start point, the routine loops back to step 400. The recovered sample is transformed at step 406.

At step 408, the start time routine samples the transformed data to produce a transform sample T, including a range of frequencies containing the frequency corresponding to the transformed trace start point. At step 410, the start time routine invokes routine precise (FIG. 11), which operates upon the transform sample T. It is preferred to invoke routine precise using weights and shapes to define the trace start, and significance testing criteria reduced below basic analysis levels. If the start time routine locates a trace start point, the trace start time is adjusted in the trace data stream (step 412), otherwise the routine loops back to step 400.

Figure 10:
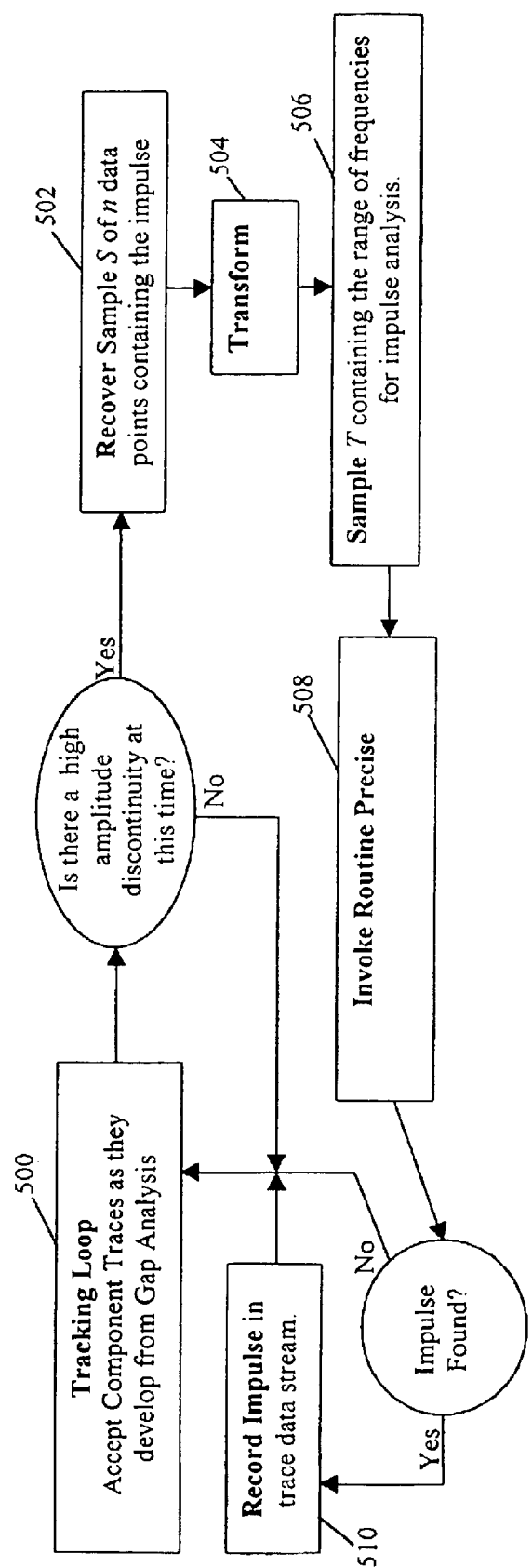
FIG. 10 is a flow diagram depicting an impulse analysis routine.

If there appears to be a discontinuity in the traces, the data at the time of the discontinuity may be examined using shapes that relate to impulse signals rather than precise frequency components (FIG. 10). This analysis characterizes the nature of an impulse, i.e., primarily the impulse amplitude, asymmetry, and duration.

At step 500, a tracking loop accepts component traces from the gap analysis routine. At step 502, if the impulse routine determines that there is a high amplitude discontinuity, a sample S of n data points is recovered containing the discontinuity (i.e. an impulse), otherwise the routine proceeds back to step 500. At step 504, the recovered sample is transformed. The impulse routine then samples the transformed data to produce transform sample T, including the range of frequencies required for impulse analysis (step 506).

Figure 11:
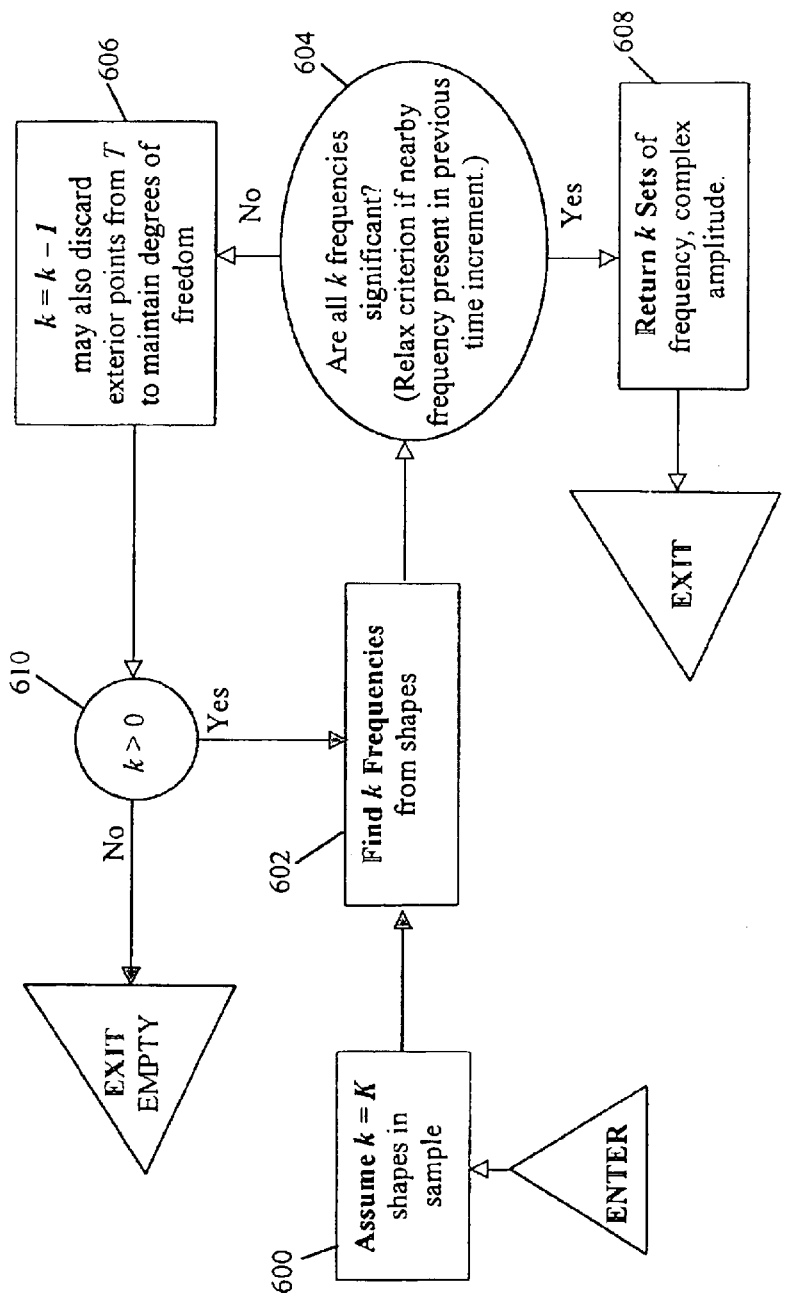
FIG. 11 is a flow diagram depicting an analysis routine.

At step 508, the impulse routine invokes routine precise (FIG. 11). Routine precise operates upon the transform sample T, preferably using weights and shapes to define an impulse, and significance testing criteria reduced below basic analysis levels. If the impulse routine locates an impulse, the routine records the impulse in the trace data stream (step 510), otherwise, the routine loops back to step 500.

As described above, the routines depicted in FIGS. 7–10 most preferably run asynchronously with the basic streaming analysis module (FIG. 6). Referring again to FIG. 6, it is preferred to treat a stream of data consisting of a signal that varies with time (step 100). This may be a voltage analog, for example. In the case of sound waves, for example, the voltage will be the analog of sound pressure.

In one aspect of the waveform analysis, the data stream is sampled and digitized at evenly spaced time intervals. However, the data stream may also be sampled and digitized at irregular time intervals, etc. (step 102). Unless it is known that higher frequencies will not be present in the signal, the signal should be filtered to remove the influence of frequencies above an upper limit of frequency determination. This will affect particularly the values determined for complex amplitude of the higher frequencies, but if the characteristics of the filter are known, the results can be adjusted to compensate for this.

At step 104, a data sequence sampler takes a sequence of n points from the data stream to form a signal sample S. According to one aspect of the waveform analysis, it may be presumed that successive signal samples overlap affecting the selection of n. There are several trade-offs involved in selecting a value of n, since n multiplied by the sampling rate equals the sample interval. Preferably, the signal components are assumed constant over the sample interval, so smaller values of n allow more accurate tracking of rapid changes.

At step 106, the signal sample S is transformed. It is appreciated that a number of transform methods are available for transforming a signal. Most preferably, the waveform analysis includes Fourier transform capabilities for performing a Fourier transform operation on the signal sample S. It is appreciated that the Fourier transform capabilities include, but are not limited to, the fast Fourier transform (FFT), discrete Fourier transform (DFT), etc. It is also appreciated that other transform methods may be utilized in the waveform analysis method, such as the Z-transform, Laplace transform, and wavelet transform methods.

The n points are transformed, producing transformed values from a low frequency, $f_0$, defined as one divided by the sample interval (1/sample interval), to a high frequency, preferably about n multiplied by $f_0$, divided by two ($n*f_0/2$). The waveform analysis method can locate frequencies above and below these limits, but it is best to use a value of n that includes all frequencies of interest.

In another aspect of the waveform analysis method, a fast Fourier transform operation is used to transform the signal (step 106). Most preferably, the fast Fourier transform operation is performed without first windowing the data, however the method may also provide useful parameter information if windowing is used.

The fast Fourier transform (FFT) operation produces complex amplitudes, commonly called "coefficients," in cells representing the frequencies: ($f_0$, two multiplied by $f_0$, three multiplied by $f_0$ . . . (n divided by two multiplied by $f_0$,)), i.e. ($f_0$, $2*f_0$, $3*f_0$, . . . ,$(n/2)*f_0$). The complex amplitudes include a real part and an imaginary part. It is important to note that the waveform analysis method does not discard the phase information contained in the complex amplitudes. Rather, as described further below, the method uses the complex parts of the complex amplitudes to determine frequencies of interest. At step 108, the results of the FFT operation are output to the transform sampler. The transform sampler preferably samples a sequence of m coefficients from the transformed results of the FFT operation. The sequence of m coefficients defines a transform sample T. The transform sample T may be sequential, sequential overlapped, or focused on local maxima and locations of frequencies from recent analyses.

At step 110, if it is determined that the current transform sample T is beyond the final transform sample T possible from the transform of the signal sample S, the results are reconciled for the signal sample S. Most preferably, reconciliation entails eliminating duplicate frequencies and choosing a most central determination (step 112). In this reconciliation, results obtained from transform samples T which contain as few additional frequency components as possible are favored, and from those, the result with the determined frequency nearest the center of its transform sample T is preferred.

If it is possible to form a transform sample T that does not go beyond the final frequency in the transformed data from signal sample S, the method invokes routine precise to locate frequencies of interest within transform sample T (step 114). As described above, it is most preferable to invoke routine precise using normal weights and shapes, and normal significance testing criteria. The significance testing criteria can be reduced below basic analysis levels for those frequencies which have been found in the previous sample S, in order to favor continuous signals.

If any frequencies are found after invoking routine precise, at step 116, the method preferably invokes routine precise again. Upon this subsequent application of routine precise, it is preferred to reposition the transform sample T to eliminate frequencies near ends of the transform sample, if possible. It is also preferred to use a weighted least squares analysis using refined weighting factors, described further below.

If the waveform analysis locates any frequencies of interest at step 116, the results are recorded using the time of the sample S, and each frequency including the corresponding complex amplitude and position within the transform sample T (step 118), and the method proceeds to step 108. If no frequencies are located at step 116, the method proceeds to step 108.

Routine precise operates to find K or fewer precise frequencies within a span of m coefficients representing a span of FFT frequencies, for example. As one example, for K equal to three, it is preferable to use the relation m=6+(3K+1)/2=11. However, it is appreciated that other values of m can be used. Routine precise most preferably operates on the selected span of m coefficients using complex arithmetic to perform a least squares fit utilizing various fitting functions as described above, to the selected data. The least squares fit extracts precise frequency components from the signal using the various fitting functions, some of which are described above. The least squares analysis is a convenient means of locating and quantifying these patterns. It will be appreciated however, that other analysis means may be used to locate and quantify these precise frequency component patterns.

One very simple realization of the waveform analysis method recognizes that precise frequency components have a functional shape which produces a pattern in the FFT in which the ratio of the real to the imaginary parts remains constant in successive FFT cells. Such a pattern in successive FFT cells establishes the existence of a precise frequency component.

The rate of decay of the pattern in successive cells defines the position of the precise frequency relative to the FFT cell frequencies. Precise frequency components which nearly match the frequency of a FFT cell tend to have rapidly decaying presence in adjacent frequencies. A precise frequency exactly in between two FFT frequencies tends to have a slowly decaying presence in adjacent frequencies.

This decaying presence of a precise frequency into adjacent frequencies, herein termed leakage, means that precise frequencies outside the span of m coefficients tend to produce interference in that span, in the form of a tail-off. Precise frequencies below the span tend to add together producing a tail that decays with increasing frequency over the span. Also, precise frequencies above the span will tend to add together producing a tail that decays with decreasing frequency over the span. Added together these two tails approximate a complex parabolic shape. As described in detail above, it is preferred to accommodate this interference by including a form such as, $C+Sf+Tf^2$, in the least squares fit. This complex parabola may be visualized as a twisted saddle shape across the transform sample.

As shown in FIG. 11, locating frequencies of interest utilizing routine precise preferably assumes that a number of functional shapes, k=K, are present in a span of the transform of the signal sample (step 600). Different functional shapes may be used in the method, depending on the nature of the signal and the preferred technique for determining one or more frequencies of interest.

At step 602, routine precise performs a least-squares fit of the k shapes to the transform sample T, using the shapes and weights defined by the routine which invoked routine precise. At step 604 the results of the least-squares fit are tested against significance criteria defined by the routine which invoked routine precise.

If Step 604 finds that less than k frequencies are significant, the routine proceeds to Step 606, where k is reduced by one. Step 610 tests the resulting k. If k is not greater than zero no frequencies were found in transform sample T and routine precise returns empty of results. If k is greater than zero the routine returns to Step 602 where the least-squares fit is repeated with one less frequency. It is preferred that as fitted frequencies are dropped it is also desirable to reduce m and thus the size of the frequency span being treated. Each precise frequency requires estimation of three quantities: the frequency of interest and the two components of the complex amplitude. Thus, three degrees of freedom are added when a frequency is dropped from the calculation. Each transform frequency coefficient is complex and thus represents two quantities, so reducing m by one subtracts two degrees of freedom. Thus, when a frequency is dropped from the calculation, most preferably m should be reduced by 1.5, so the degrees of freedom in the fit may only be approximately maintained. Since m is an integer, in practice m is decreased alternately by one and then two.

When Step 604 finds k frequencies that are significant, the routine proceeds to step 608. At step 608, routine precise reports the k (frequency, complex amplitude) sets determined to be significant and exits.

Once routine precise returns a result to the basic streaming analysis and asynchronously running routines, weights for the least squares are preferably recalculated based on the frequencies actually found. Weighting factors are very important to the proper operation of the least squares fit. The strongest influence of a precise frequency component is in the FFT frequency cells that immediately surround it and it is most preferred to give those adjacent cells heavier weighting than the cells trailing away to either side. If more than one frequency set is reported, the span of transform sample T is reexamined to see if it can be repositioned to minimize the number of frequencies located in the repositioned span. The analysis is resubmitted to routine precise to refine the calculation of the precise frequency, completing the loop of the waveform analysis method (steps 116–118, FIG. 6). It will be appreciated that various mechanisms may be used to implement the foregoing method. For example, the method may be encoded in a computer readable medium for implementation by a computer program. The foregoing method may also be implemented as part of the processing capabilities of a microprocessor, for example.

Variations of the Least Squares Method

It is appreciated that there are many variations on the above least squares method which may prove useful in specific situations. In particular, once a specific precise frequency component has been determined, it may be expedient to remove that component as an aid in finding other components of lesser amplitude. There are a number of different ways in which the component can be removed. Its contribution to the DFT (or FFT) can be calculated, either directly from the formula or by performing a DFT on the extracted component, and that contribution subtracted from the DFT prior to performing further fits. Rather than direct removal, components which have been determined may be partially represented in the least squares formulation. For instance, Equation (10) can be revised to the form:

$$y = C + Sk + Tk^2 + \sum_{p=1}^{n} \frac{A'_p}{(k+\varepsilon_p)} + \sum_{q=1}^{h} \frac{A'_q}{(k+\varepsilon_q)} \quad (31)$$

Here $$\sum_{q=1}^{h} \frac{A'_q}{(k+\varepsilon_q)}$$

represents h components which have already been determined. If it is assumed that both $A_q'$ and $\varepsilon_q$ are known, the effect is just to subtract the influence from the DFT prior to the fit, that is, y is effectively replaced by $$y - \sum_{q=1}^{h} \frac{A'_q}{(k+\varepsilon_q)}.$$

However, it also usefully may be assumed that $\varepsilon_q$, the precise frequencies themselves, are known more precisely than the associated complex amplitudes, so that the $\varepsilon_q$ may be set in advance and the $A_q'$ may be determined as part of the least squares fit, considerably reducing the complexity of a least squares calculation for n+h precise frequency components. In some cases, amplitudes which are re-determined assuming known frequencies may be found to be more accurate than those originally determined.

Overtones

In cases such as the analysis of musical sounds, very much can be gained by analyzing the sounds in terms of overtones. During times when the music, or vibrations, are less complex, it can be determined which overtones track with specific fundamental precise frequencies. In the analysis of more complicated signals, this information can be used to help extract the tones. For example, where the amplitude of a fundamental may be less certain due to confounding, a more certain overtone may help in determining it. The complete analysis of a signal for its precise frequency components benefits from cataloging the response of basic physical elements which normally include the fundamental/overtone pattern for each particular sound or vibration.

Alternate Forms

The form used for g(t) to obtain Equation (2) from Equation (1) was a sinusoid of a precise frequency. This entire method is equally applicable to other forms.

$$F(g(t), n) = \frac{1}{\tau} \int_0^\tau g(t) e^{-\frac{i2\pi nt}{\tau}} dt \quad [1]$$

Suppose g(t) is a sinusoid of frequency $2\pi(n+\delta+\beta t)/\tau$ and further that $$g(t) = (A + \alpha t) e^{\frac{2\pi(n+\delta+\beta t)}{\tau}},$$

where A and $\alpha$ are complex constants so that, $$F(g(t), n) = \frac{1}{\tau} \int_0^\tau (A + \alpha t) e^{\frac{2\pi(n+\delta+\beta t)t}{\tau}} e^{-\frac{i2\pi nt}{\tau}} dt \quad (32)$$

$$= \frac{A}{\tau} \int_0^\tau e^{\frac{2\pi i \delta t}{\tau}} e^{\frac{2\pi i \beta t^2}{\tau}} dt + \frac{\alpha}{\tau} \int_0^\tau e^{\frac{2\pi i \delta t}{\tau}} e^{\frac{2\pi i \beta t^2}{\tau}} t \, dt$$

Which evaluates to:

$$F(g(t), n) = \frac{1}{2\tau} \left[ \frac{A\sqrt{\pi}\, e^{-\frac{i\pi\delta^2}{2\beta\tau}} \left[ \mathrm{erf}\left(\sqrt{-2i\pi\beta\tau} - \frac{i\pi\delta}{\sqrt{-2i\pi\beta\tau}}\right) + \mathrm{erf}\left(\frac{i\pi\delta}{\sqrt{-2i\pi\beta\tau}}\right) \right]}{\frac{\sqrt{-2i\pi\beta\tau}}{\tau}} + \right. \quad (33)$$

$$\left. \alpha \left[ \frac{-i\tau(e^{2i\pi(\delta+\beta\tau)} - 1)}{2\pi\beta} - \right. \right.$$

$$\left. \left. \frac{\delta\sqrt{\pi}\, e^{-\frac{i\pi\delta^2}{2\beta\tau}} \mathrm{erf}\left[ \mathrm{erf}\left(\sqrt{-2i\pi\beta\tau} - \frac{i\pi\delta}{\sqrt{-2i\pi\beta\tau}}\right) + \mathrm{erf}\left(\frac{i\pi\delta}{\sqrt{-2i\pi\beta\tau}}\right) \right]}{2\beta \sqrt{\frac{-2i\pi\beta\tau}{\tau}}} \right] \right]$$

While this is clearly of much higher complexity than the form for a single, unvarying frequency, it should be noticed immediately that once again the expression in Equation (33) does not depend upon n and thus can be treated in much the same manner as we earlier treated Equation (3). This independence of n is not necessary to successful analysis, but of course it is very helpful.

The function being fit need not be periodic or even quasi-periodic. Consider the square impulse:

$$g(t) = \begin{cases} A, & T_0 \le t \le T_1 \\ 0, & \text{otherwise} \end{cases} \quad (34)$$

Then, $$F(g(t), n) = \frac{A}{\tau} \int_{T_0}^{T_1} e^{-\frac{i2\pi nt}{\tau}} dt = \frac{iAe^{-\frac{i2\pi nt}{\tau}}}{2\pi n} \Bigg|_{T_0}^{T_1} \quad (35)$$

$$F(g(t), n) = iA \left( \frac{e^{-\frac{i2\pi nT_1}{\tau}} - e^{-\frac{i2\pi nT_0}{\tau}}}{2\pi n} \right)$$

Unlike the examples above, Equation (35) does depend directly upon n, so that the shape this function imposes on the DFT depends upon its position within the sample interval. Other quasi-periodic functions may produce shapes which depend upon the sample interval. Consider the precise frequency component which suddenly starts at time $T_0$ within a sample interval:

$$g(t) = \begin{cases} Ae^{\frac{i2\pi(n+\delta)t}{\tau}}, & t \ge T_0 \\ 0, & t < T_0 \end{cases}$$

Then, $$F(g(t), n) = \frac{1}{\tau} \int_{T_0}^{\tau} Ae^{-\frac{i2\pi(n+\delta)t}{\tau}} e^{-\frac{i2\pi nt}{\tau}} dt = \frac{A}{\tau} \int_{T_0}^{\tau} e^{\frac{i2\pi\delta t}{\tau}} dt \quad (36)$$

$$F(g(t), n) = \frac{iA\left(e^{\frac{i2\pi\delta T_0}{\tau}} - e^{i2\pi\delta}\right)}{2\pi\delta}$$

The techniques for treating these characteristic forms within the DFT and for extracting them using least squares or other means differ in detail from the techniques used for the single precise frequency form, but the essential method is the same. It is important to recognize that several different types of forms may be extracted from the same DFT.

It is contemplated, and will be apparent to those skilled in the art from the preceding description and the accompanying drawings that modifications and/or changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A method of extracting information from a signal, the signal having properties which vary with respect to time, the method comprising the steps of:
   (a) providing a signal, the signal including a finite number of component signals, the component signals in combination defining the signal,
   (b) analyzing the signal to determine the component signals, the analysis comprising the steps of:
      (1) defining a signal analysis sample interval, the signal analysis sample interval being within a boundary, wherein at least one component signal is included within the signal analysis sample interval,
      (2) transforming the signal over the signal analysis sample interval using a transform method to produce a transform of the signal comprising transform coefficients,
      (3) fitting a function having real and imaginary parameters to a number of transform coefficients to determine a best fit function within the signal analysis sample interval, and
      (4) performing a mathematical operation on the best fit function to yield parameter information within the signal analysis sample interval, and
   (c) extracting at least one parameter resulting from the mathematical operation, the parameter representing a characteristic of a component signal.

2. The method of claim 1 wherein step (b)(2) further comprises the step of transforming the signal over the signal analysis sample interval using a Fourier transform method.

3. The method of claim 2 wherein using a Fourier transform method further comprises the step of using a discrete Fourier transform method or fast Fourier transform method to transform the signal over the signal analysis sample interval producing a number of transform coefficients.

4. The method of claim 3 further comprising the step of fitting a function to a number of transform coefficients, the function having a form:

$$y = \frac{A'}{(k+\varepsilon)},$$

where, $$A' = A\frac{i(1-e^{i2\pi\varepsilon})}{2\pi},$$

$y$ = a transform coefficient, $A$ = a complex constant, $\varepsilon$ = a real constant, and $k$ = an index number of transform coefficient $y$.

5. The method of claim 3 further comprising the step of fitting a function to a number of transform coefficients, the function having a form:

$$y = C + Sk + Tk^2 + \sum_{p=1}^{n} \frac{A'_p}{(k+\varepsilon_p)}$$

where, $$A'_p = A_p \frac{i(1-e^{i2\pi\varepsilon_p})}{2\pi},$$

$y$ = a transform coefficient, $A_p$ = complex constants, $\varepsilon_p$ = real constants, $k$ = an index number of transform coeffiecient y, $n$ = total number of $A_p$, $\varepsilon_p$ constants used in the form, $C$ = a complex constant, $S$ = a complex constant, and $T$ = a complex constant.

6. The method of claim 3 further comprising the step of selecting a range of transform coefficients corresponding to a number of degrees of freedom required to perform a fit.

7. The method of claim 3 further comprising the step of selecting a range of transform coefficients corresponding to a number of degrees of freedom required to perform a fit and to permit error smoothing.

8. The method of claim 1 further comprising the step of dividing a real component of a transform coefficient by an imaginary component of the transform coefficient thereby providing a ratio, and predicting the existence of component signals which component signals aggregately define the signal based upon one or more ratios.

9. The method of claim 8 further comprising the step of identifying a precise frequency component when a rate of decay of a pattern of ratios in adjacent frequency cells is greater than a predefined number.

10. The method of claim 8 further comprising the step of identifying a precise frequency component when a rate of decay of a pattern of ratios in adjacent frequency cells is less than a predefined number.

11. The method of claim 1 wherein step (b) further comprises assuming that the signal comprises a finite number of frequency components having specific values.

12. The method of claim 1 wherein step (b)(2) further comprises using a Laplace transform method, Z-transform method, or wavelet transform method to transform the signal over the signal analysis sample interval.

13. The method of claim 1 wherein step (c) further comprises extracting sinusoidal components of the signal wherein the sinusoidal components in combination represent the signal.

14. A computer readable medium with a computer program for implementing the method of claim 1.

15. A microprocessor including processing capabilities for implementing the method of claim 1.

16. The method of claim 1 further comprising the step of outputting a parameter including one or more precise frequencies and corresponding complex amplitudes having real and imaginary parts.

17. A method of extracting information from a signal comprising the steps of:
    converting the signal to a digital format to produce a digitized signal having a number of digital points,
    sampling a number of the digital points of the digitized signal to produce digital samples,
    transforming a digital sample to produce a transform of the digital sample having a number of transform coefficients,
    sampling a number of the transform coefficients to produce a transform sample,
    determining signal information from the transform sample, the determining comprising the steps of:
    assuming a number of shapes characterize the transform sample, each shape having a characteristic mathematical relation, and
    performing a test of statistical significance on the transform sample using one or more shapes, and
    outputting signal information based on the test of statistical significance.

18. The method of claim 17 further comprising the step of fitting a curve having a number of fitting constants to the transform sample.

19. The method of claim 17 further comprising the step of including a correction factor as part of the mathematical relation, the correction factor approximating and accounting for influencing behavior of adjacent component signals.

20. The method of claim 17 further comprising the step of using a normal distribution of weights, shapes, and normal significance testing criteria on the transform sample to perform the test of statistical significance.

21. The method of claim 17 further comprising the step of transforming the digital sample using a Fourier transform method, the transformed sample including complex amplitudes in frequency cells, the complex amplitudes including real and imaginary pails.

22. The method of claim 17 further comprising the step of using a least squares method when performing the test of statistical significance.

23. A microprocessor including processing capabilities for implementing the method of claim 17.

24. A computer readable medium including a computer program for implementing the method of claim 17.

25. A method of analyzing a signal comprising:
    digitizing the signal to produce a digitized signal, the digitized signal having a number of digital points,
    selecting a number of digital points to form a signal sample,
    transforming the signal sample to produce a transform of the signal sample, the transform of the signal sample having a number of transform coefficients,
    selecting a number of transform coefficients to form a transform sample,
    evaluating the transform sample, the evaluation comprising the steps of:
        assuming the transform sample includes a number of characteristic shapes, and
        determining a number of signal parameters from the number of shapes using a predetermined analysis technique, the analysis technique using parameter weighting, the number of characteristic shapes, and criteria for significance testing, and
    extracting at least one signal parameter from the signal.

26. The method of claim 25 further comprising the step of extracting a number of frequencies and complex amplitudes, the extracted frequencies and complex amplitudes corresponding to predetermined rules of acceptability.

27. A method of determining signal information from a signal comprising the steps of:
    digitizing the signal to produce a digital signal,
    sampling the digital signal to produce digital signal samples,
    transforming a digital signal sample to produce a transform of the digital signal sample including a number of transform coefficients having real and imaginary components,
    fitting one or more functions to a number of transform coefficients, each function having real and imaginary components, and
    outputting signal information based on the result of the fitting step, the signal information having a relation to a ratio of a real to an imaginary component of one or more transform coefficients.

* * * * *